July 7, 1959 R. S. MAUTNER 2,894,240

SOCKETS FOR PRINTED ELECTRICAL CIRCUITS

Filed Dec. 23, 1955

INVENTOR.
ROBERT S. MAUTNER

BY [signature]

ATTORNEY

United States Patent Office 2,894,240
Patented July 7, 1959

2,894,240

SOCKETS FOR PRINTED ELECTRICAL CIRCUITS

Robert S. Mautner, Amityville, N.Y.

Application December 23, 1955, Serial No. 554,960

3 Claims. (Cl. 339—17)

This invention relates to electrical sockets or other pin receptacles for printed circuits and more specifically to sockets of the miniature type for receiving the connecting pins of transistors, diodes, tubes and any other pin equipped circuit elements.

More and more electronic equipment such as television receivers, broadcast receivers, test equipment, is manufactured today using printed circuit panels on boards as the "chassis" or mechanical mount for assembling the various components used in performing the electrical functions of such devices.

As is well known the "printed" or "stamped" circuit consists of sheet of bakelite or other insulating material on which there is affixed a pattern of metallic traces or lines to serve as the conductive connections between various components.

The copper or other conductive pattern may appear on one or both sides of the board.

The components are usually inserted through appropriate holes in the "printed" board and generally the printing is most frequently used on one side of a board and the components inserted through holes from the opposite side. It is then possible to insert all components and solder all components simultaneously to the connecting copper line pattern by dipping in a solder bath.

While such procedure results in savings of time and in uniform quality of production, it is necessary in many cases to have the electrical components replaceable for reasons such as maintenance or limited life. In such cases special tube sockets have been designed which, however, are expensive and difficult to apply.

In accordance with the invention considerable savings in cost can be made over the prior methods providing a means for inserting electrical or electronic components of the type which might require replacement or which might be damaged as a result of heat transferral from the solder-dip bath. Such components are electronic tubes, transistors, diodes or other semi-conductor devices.

It is therefore one of the objects of the invention to provide a transistor socket or the like in the form of an eyelet having a substantially cylindrical wall portion provided with longitudinal indentations for receiving the transistor pins with spring tension.

Another object of the invention is to provide a transistor socket or the like in the form of an eyelet socket having a substantially cylindrical wall portion provided with longitudinal indentations for receiving the transistor pins with spring tension.

Another object of the invention is to provide a socket in the form of an eyelet socket, closed at the bottom end to prevent the socket from being filled up with solder during processing.

A further object of the invention is to provide a printed circuit assembly having one or more eyelet shaped transistor sockets or the like attached to the circuit panel and projecting therefrom, with a solder or other conducting layer being formed over the closed end of the eyelet socket and at least a portion of the conducting trace or traces connected thereto.

These and other objects of the invention will be more fully apparent from the drawings annexed herewith in which Figs. 1 and 2 represent in side and top elevations respectively one embodiment of the invention.

Figure 1:
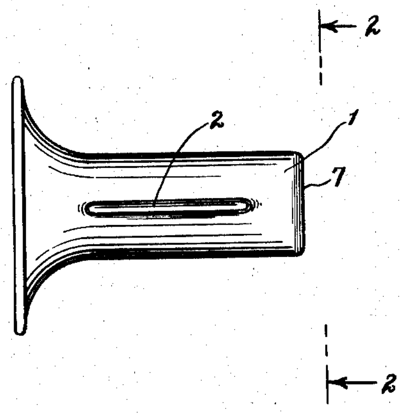
Figure 2:
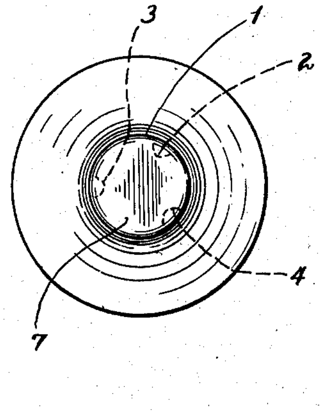

In Figs. 1 and 2 the socket is shaped in the form of a new type eyelet socket, the cylindrical or approximately cylindrical bottom portion of which is provided with longitudinal indentations such as grooves, dimples, flutes or bend-ins, each arranged to extend in a direction substantially parallel to the axis of the cylinder and all arranged substantially symmetrically over the circumference of cylinder 1 as schematically indicated in Fig. 1 at 2 and in Fig. 2 at 2, 3 and 4 respectively.

Figure 3:
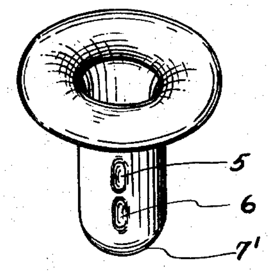
Fig. 3 represents a modification of Figs. 1 and 2 in front elevation.

In the modification of Fig. 3 there are two dimples or flutes, 5 and 6, arranged in a direction parallel to the axis of the cylinder in cascade, to increase springiness while facilitating insertion and withdrawal of the connector pin.

Cylindrical portion 1 is closed or "blinded" at the bottom end 7, 7′ of the eyelet sockets shown in Figs. 1 and 3 respectively.

The closed end (blind) of the eyelet will prevent solder from filling the eyelet socket and render insertion of the tube or transistor difficult if not impossible.

Eyelet sockets of the "blind" variety if "dimpled" or "fluted," and if made of spring brass or similar material will act as a socket clip and will receive the pins of a tube or transistor with sufficient tension to provide good contact.

If the eyelet sockets are inserted into the printed board along with the other electrical components that are to be soldered to the board, they will then provide a "built-in" socket for receiving such special replaceable components.

Such eyelet sockets are mass produced and extremely low in price. Their use in this fashion permits ready modification of placement and number of elements desired to be connected, easy accommodation of various lead lengths by eyelet length variations and other assembling and operating advantages.

Special punch shapes, for various size pockets, are eliminated as well as elimination or reduction of socket cost itself.

Where heat may affect or permanently damage a device such as a transistor, all the advantages of "soldering in" such a device, without attendant disadvantages is hereby attained.

The invention covers a blind eyelet socket of any desired shape which has one or more indentations, perforations, flutes, grooves or bumps along its side to provide spring pressure against any wire lead insert into the body of eyelet socket, thus permitting it to act as socket contact clip for printed circuit use which can be solder-dipped without destroying its holding action and which permits construction of a socket or receptacle of extreme economy and of simple and variable design.

The invention is not limited to the shape of the eyelet socket and to the number and shape and arrangement of indentations shown or described but may be applied in any form or manner whatsoever without departing from the framework of this disclosure.

Figure 4:
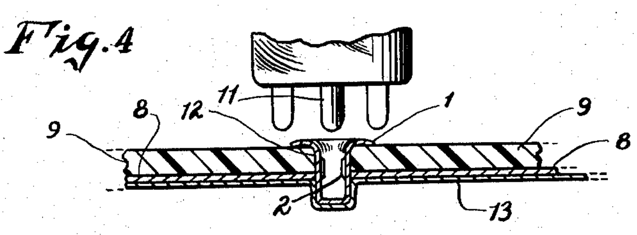
Fig. 4 shows in cross section an assembly of eyelet socket and printed circuit in accordance with certain principles of the invention.

In Fig. 4 an eyelet socket such as illustrated in Figs. 1 and 2 or in Fig. 3, respectively, is schematically shown as applied to a printed circuit assembly arranged and produced, in otherwise well known manner, on one or both sides of a Bakelite plate or any other insulating panel 9.

Conducting copper traces of the printed circuit are indicated at 8.

An eyelet shaped socket 1 is shown attached to panel 9 and to copper trace 8, ready to receive the pin of a transistor, diode, miniature tube or the like pin-equipped circuit element, as schematically indicated in Fig. 4 at 11.

After attaching or pushing eyelet socket 1 through appropriate holes 12 of panel 9 and copper trace 8, socket 1 will project from panel 9 and copper trace 8 by a predetermined distance, for example, for a considerable length corresponding to the thickness of panel 8, say, for about 3/16 to 1/4 of an inch.

After attachment of socket 1 the bottom surface of the entire circuit panel is briefly dipped into a hot solder bath. The resulting conducting layer forms the desired circuit connections by adhering to the surface of conducting traces 8 and over the closed bottom end of socket 1, and over these parts only, in the form of a conducting layer indicated in Fig. 4 at 13.

Hole 12 through panel 9 and conductor trace 8 is appropriately so dimensioned, i.e., slightly smaller than the outer diameter of the cylindrical portion of eyelet socket 1, as to permit insertion of pin 11 into socket 1 under spring pressure.

Here too by permitting the outer faces of indentations 2, 3 and 4 to slightly approach each other flexibly, the indentations provided in accordance with the invention, insure attachment of the socket without additional operations, and in order to further facilitate insertion, the cylindrical portion towards its end is made slightly conical.

The invention is not limited to the use of the printed circuit assembly shown and described. Any sort of attachment of the eyelet sockets with or in combination with printed circuits or insulating panels may be provided in accordance with this invention and without departing from the scope of this invention.

I claim:

1. A printed circuit structure comprising an insulating panel having at least on one surface thereof longitudinal conducting traces forming electrical connections, at least one opening in said panel passing through at least one of said conducting traces, an eyelet-shaped socket for receiving a connector pin and attached to said panel and conducting trace through openings therein, and projecting from said conducting trace; said eyelet shaped socket being made of spring metal having a cylindrical portion substantially completely closed except at the top; said cylindrical portion having in its wall indentations arranged symmetrically with respect to the axis of the cylinder and projecting substantially toward the inside of said cylinder so as to receive the connector pin with spring pressure; and a conducting layer applied over said closed end of said eyelet-shaped socket and over at least adjacent portions of said conducting trace.

2. Assembly according to claim 1, wherein said holes are smaller than the outer diameter of the cylindrical portion of said eyelet-shaped socket, said cylindrical portion fitting into said hole under spring pressure controlled by said indentations.

3. Assembly according to claim 1, wherein said eyelet-shaped socket projects from the first conducting layer to a predetermined distance corresponding at least approximately to the thickness of said insulating panel.

References Cited in the file of this patent

UNITED STATES PATENTS

| | | |
|---|---|---|
| 2,318,868 | Kimbell | May 11, 1943 |
| 2,607,821 | Van Arsdell | Aug. 19, 1952 |
| 2,631,184 | Sampson | Mar. 10, 1953 |

FOREIGN PATENTS

| | | |
|---|---|---|
| 149,806 | Switzerland | Sept. 30, 1931 |
| 228,314 | Switzerland | May 15, 1942 |
| 649,254 | Great Britain | Jan. 24, 1951 |